United States Patent
Nagrodsky et al.

(10) Patent No.: US 12,556,178 B2
(45) Date of Patent: Feb. 17, 2026

(54) SOLID STATE SWITCH, IN PARTICULAR FOR RAILWAY EQUIPMENT

(71) Applicant: KB Signaling Inc., West Henrietta, NY (US)

(72) Inventors: Nicholas Nagrodsky, Melbourne, FL (US); Tony Spagnolia, Melbourne Beach, FL (US); Jared Cooper, Melbourne, FL (US)

(73) Assignee: KB Signaling Inc., Grain Valley, MO (US)

( * ) Notice: Subject to any disclaimer, the term of this patent is extended or adjusted under 35 U.S.C. 154(b) by 0 days.

(21) Appl. No.: 18/777,280

(22) Filed: Jul. 18, 2024

(65) Prior Publication Data

US 2026/0025134 A1   Jan. 22, 2026

(51) Int. Cl.
*H03K 17/687*   (2006.01)
*G01R 31/327*   (2006.01)
*H03K 19/173*   (2006.01)

(52) U.S. Cl.
CPC ....... *H03K 17/687* (2013.01); *G01R 31/3277* (2013.01); *H03K 19/173* (2013.01)

(58) Field of Classification Search
CPC . H03K 17/687; H03K 19/173; G01R 31/3277
See application file for complete search history.

(56) References Cited

U.S. PATENT DOCUMENTS 3,569,730 A * 3/1971 Wetmore ............... B61L 29/288
                                                                326/14
4,365,777 A * 12/1982 Geiger .................. B61L 29/226
                                                                246/130

* cited by examiner

*Primary Examiner* — Lincoln D Donovan
*Assistant Examiner* — Amit R Bhatia
(74) *Attorney, Agent, or Firm* — David L. Nocilly; Bond Schoeneck & King PLLC

(57) ABSTRACT

A solid state switch, in particular for a railroad equipment, including: an isolation boundary, the isolation boundary galvanically isolating a first zone from a second zone; at least one switch, each switch being adapted to switch a current in the first zone between a switch input terminal and a switch output terminal; at least one relay operating signal input terminal adapted to receive an operating signal, the operating signal indicating whether to switch the at least one switch; at least two channels, each channel including: for each switch a switch module in the first zone, each switch module including a switch module input terminal, a switch module output terminal and a semiconductor switch adapted to switch the current between the switch module input terminal and the switch module output terminal; at least one programmable device in the second zone, the at least one programmable device including an input terminal.

14 Claims, 6 Drawing Sheets

SOLID STATE SWITCH, IN PARTICULAR FOR RAILWAY EQUIPMENT

FIELD

The present disclosure concerns a solid-state switch, in particular for railway equipment.

According to another aspect, the present disclosure relates to a railway equipment.

According to a further aspect, the present disclosure relates to a method for operating a solid state switch.

BACKGROUND

The electromechanical relay is an electrically operated switch. An electro-mechanical relay requires regular testing and maintenance of it's moving parts that wear over time to confirm functionality. Further, a mechanical relay is expensive and requires a time consuming assembly. Further, contacts can arc due to mechanical conductive parts touching. There exist solid state relays, however they have not been used for vital functions.

SUMMARY

According to one aspect, a solid state switch is provided, in particular for railroad equipment, comprising:
  an isolation boundary, the isolation boundary galvanically isolating a first zone from a second zone;
  at least one switch, each switch being adapted to switch a current in the first zone between a switch input terminal and a switch output terminal;
  at least one relay operating signal input terminal adapted to receive an operating signal, the operating signal indicating whether to switch the at least one switch;
  at least two channels, each channel comprising:
    for each switch a switch module in the first zone, each switch module comprising a switch module input terminal, a switch module output terminal and a semiconductor switch adapted to switch the current between the switch module input terminal and the switch module output terminal;
    at least one programmable device in the second zone, the at least one programmable device comprising an input terminal for receiving the operating signal, at least one switch driving terminal for driving the switch module of the respective channel and at least one monitoring terminal for each switch module for monitoring the respective switch module;
    a control connection connecting the switch driving terminal of the at last one programmable device and a control terminal of the semiconductor switch, wherein the control connection comprises at least one first photovoltaic isolator for bridging the isolation boundary;
    at least one monitoring circuit for each switch module connecting the respective monitoring terminal of the at least one programmable device, wherein the monitoring circuit comprises at least one galvanic isolator for bridging the isolation boundary, wherein the monitoring circuit connects to at least one of the switch module input terminal and the switch module output terminal.

Further embodiments may relate to one or more of the following features, which may be combined in any technical feasible combination:
  for each channel the at least one programmable device is adapted to inject a test signal on one side of a switch module of a switch and to measure a voltage on the other side of the same switch module in order to determine whether the semiconductor switch is in an open or closed state;
  the programmable devices of each channel is an FPGA;
  for each switch, the switch modules of the respective channels are connected in series, such that the semiconductor switches of the respective switch modules of each switch are connected in series;
  the semiconductor switch is a field effect transistor, in particular a metal oxide semiconductor field effect transistor, wherein the control terminal is a gate of the field effect transistor;
  the monitoring circuit of a respective channel connects the programmable device, in particular the monitoring terminal of the programmable device, to both, the switch module input terminal and the switch module output terminal of the same channel;
  the semiconductor switch of the switch module of the first channel and the semiconductor switch of the switch module of the second channel are arranged in opposite directions, wherein, in particular the drains of both semiconductor switches or the sources of both semiconductor switches are coupled;
  the at least one galvanic isolator of the monitoring circuit of each channel comprises respectively a photovoltaic isolator, a secondary side of the galvanic isolator of the monitoring circuit of the first channel is electrically connected between the first input of an isolation amplifier and the switch module input terminal of the switch module of the first channel, the switch module input terminal having the same electrical potential as the switch input terminal, and a secondary side of the galvanic isolator of the monitoring circuit of the second channel is electrically connected between the first input of the isolation amplifier and the switch module output terminal of the switch module of the second channel, the switch module output terminal having the same electrical potential as the switch output terminal, the second input of the isolation amplifier being coupled to the switch module output terminal of the switch module of the first channel;
  the at least one galvanic isolator of the monitoring circuit is selected from the group consisting of a capacitor, a second photovoltaic isolator, and an isolation amplifier;
  the programmable device is adapted to apply a test signal to the monitoring circuit; and/or
  the test signal is a rectangular signal.

According to another aspect, a railroad equipment is provided comprising a solid state switch, the solid state switch comprising:
  an isolation boundary, the isolation boundary galvanically isolating a first zone from a second zone;
  at least one switch, each switch being adapted to switch a current in the first zone between a switch input terminal and a switch output terminal;
  at least one relay operating signal input terminal adapted to receive an operating signal, the operating signal indicating whether to switch the at least one switch;
  at least two channels, each channel comprising:
    for each switch a switch module in the first zone, each switch module comprising a switch module input terminal, a switch module output terminal and a semiconductor switch adapted to switch the current between the switch module input terminal and the switch module output terminal;

at least one programmable device in the second zone, the at least one programmable device comprising an input terminal for receiving the operating signal, at least one switch driving terminal for driving the switch module of the respective channel and at least one monitoring terminal for each switch module for monitoring the respective switch module;

a control connection connecting the switch driving terminal of the at last one programmable device and a control terminal of the semiconductor switch, wherein the control connection comprises at least one first photovoltaic isolator for bridging the isolation boundary;

at least one monitoring circuit for each switch module connecting the respective monitoring terminal of the at least one programmable device, wherein the monitoring circuit comprises at least one galvanic isolator for bridging the isolation boundary, wherein the monitoring circuit connects to at least one of the switch module input terminal and the switch module output terminal.

According to another aspect, a method for operating a solid state switch is provided, the solid state switch comprising:

an isolation boundary, the isolation boundary galvanically isolating a first zone from a second zone;

at least one switch, each switch being adapted to switch a current in the first zone between a switch input terminal and a switch output terminal;

at least one relay operating signal input terminal adapted to receive an operating signal, the operating signal indicating whether to switch the at least one switch;

at least two channels, each channel comprising:
  for each switch a switch module in the first zone, each switch module comprising a switch module input terminal, a switch module output terminal and a semiconductor switch adapted to switch the current between the switch module input terminal and the switch module output terminal;

at least one programmable device in the second zone, the at least one programmable device comprising an input terminal for receiving the operating signal, at least one switch driving terminal for driving the switch module of the respective channel and at least one monitoring terminal for each switch module for monitoring the respective switch module;

a control connection connecting the switch driving terminal of the at last one programmable device and a control terminal of the semiconductor switch, wherein the control connection comprises at least one first photovoltaic isolator for bridging the isolation boundary;

at least one monitoring circuit for each switch module connecting the respective monitoring terminal of the at least one programmable device, wherein the monitoring circuit comprises at least one galvanic isolator for bridging the isolation boundary, wherein the monitoring circuit connects to at least one of the switch module input terminal and the switch module output terminal, the method comprising:

upon receiving by each programmable device of an operating signal, providing by each programmable device a switch drive signal to the switch modules;

for each channel, the respective programmable device determining for at least one switch module of the channel whether the semiconductor switch is in an open or closed state by injecting a test signal into the monitoring circuits and reading the monitoring circuits;

in response of detection of a failure of a switch module of a switch by one of the programmable devices informing the programmable device of the other channels about this failure; and in response to receiving an information about a failure of a first switch module of a switch by a programmable device of another channel, deactivating, by the programmable device, a second switch module of the switch.

According to an embodiment, the method further comprising determining for at least one switch module of the channel whether the semiconductor switch is in an open or closed state includes injecting the test signal on one side of the respective switch module and measuring on the other side of the switch module. Further advantages, features, aspects and details are evident from the dependent claims, the description and the drawings.

BRIEF DESCRIPTION OF THE DRAWINGS

The accompanying drawings relate to embodiments of the present disclosure and are described in the following.

DETAILED DESCRIPTION

The present disclosure provides a solid state switch. A solid state relay (SSR) or a solid state switch is an electronic switching device that switches on or off an electrical connection between at least one pair of contacts when an external voltage is applied across its control terminals. The connection between a pair of contacts can be a normally open (NO) or a normally closed (NC) switch.

The switch may be a normally open contact (NO) when current flow is inhibited between the pair of contacts when the electromechanical relay is in its non-actuated state, or may be a normally closed (NC) switch when a current flow is enabled between the pair of contacts when the relay is in its non-actuated state.

A solid state switch requires less maintenance or testing and has lower assembly costs. Further, there are no moving parts subject to vibration. Further, substantially no minimum contact current is required and no arcing is possible.

With respect to safety functions, vital relays must comply with safety standards, in particular have a particular safety integrity level (SIL). The International Electrotechnical Commission's (IEC) standard IEC 61508 defines SIL using requirements grouped into two categories: systematic safety integrity and hardware safety integrity. A device or system must meet the requirements for both categories to achieve a specific SIL. In order to achieve a given SIL, the device must meet targets for the maximum probability of dangerous failure and a minimum safe failure fraction. According to an embodiment, the solid state switch achieves the SIL4 level.

According to an example, the solid-state switch is for example a fail-safe solid state switch.

Figure 1:
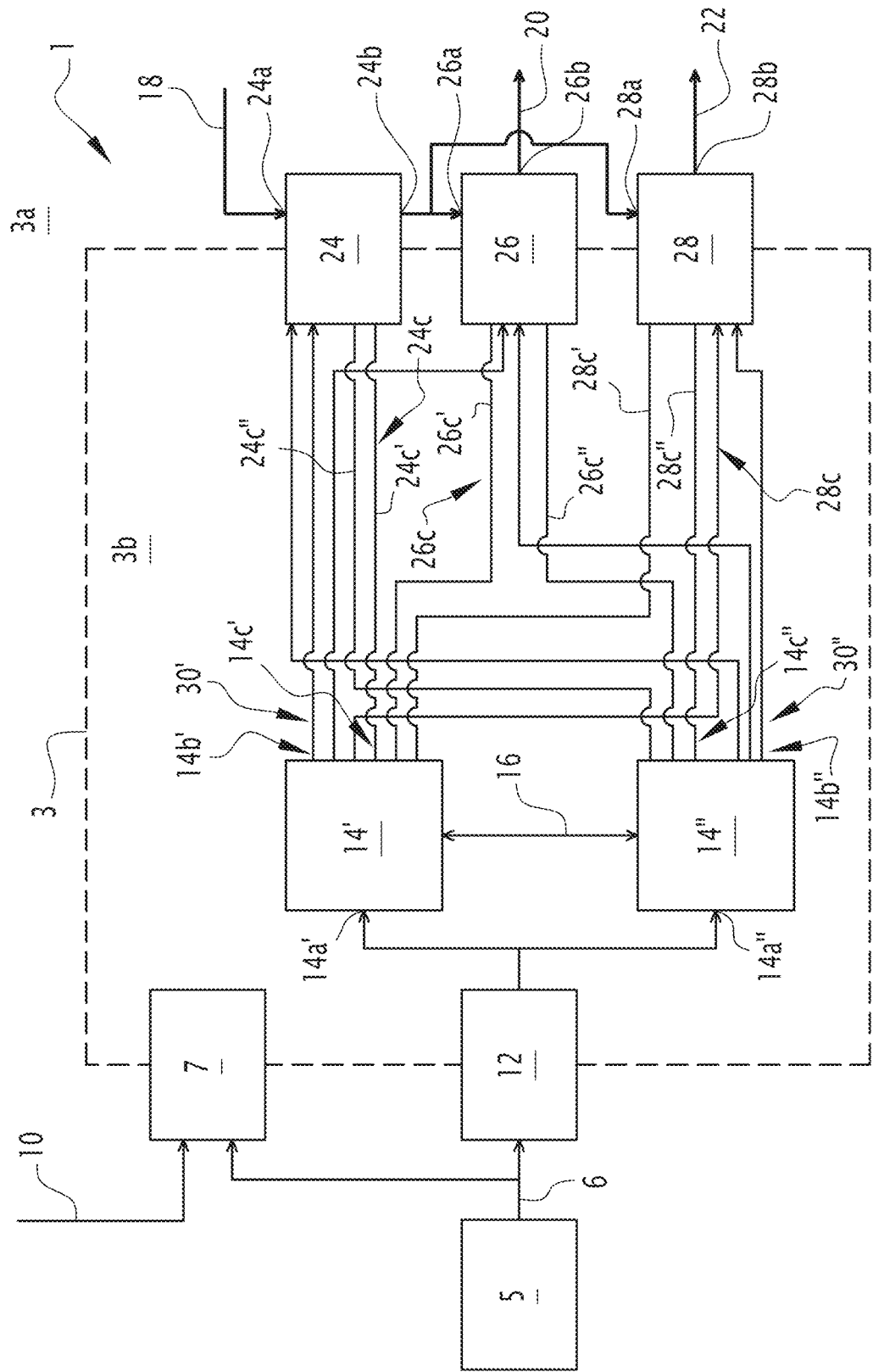
FIG. 1 shows the overall architecture of a solid state switch according to an embodiment.

The solid state switch is adapted to switch voltages of between 0V and 230V, and switch currents between 0 A and 60 A FIG. 1 shows the overall architecture of a (vital) solid state switch 1 according to an embodiment. The dashed line 3 indicates an isolation boundary. The isolation boundary isolates galvanically a first zone 3*a* from a second zone 3*b*. In other words, no direct current flow is permitted between the first zone 3*a* and the second zone 3*b*. A voltage source 5 powers the solid state switch 1. The voltage source 5 provides also the operating signal whether to switch the pair of contacts of the solid state switch 1. The voltage source can provide AC or DC power. In other embodiments, it can be also be AC or DC return/ground. The voltage source 5 provides a 'high' or 'low' signal for switching the pair of contacts of the solid state switch 1.

The voltage source 5 is connected to a relay operating signal input terminal 6.

Further, FIG. 1 shows a DC/DC converter 7 adapted to power the internal circuitry of the solid state switch 1. The input of the DC/DC converter 7 is connected to the voltage source 5. The output of the DC/DC converter 7 powers different devices of the solid state switch 1.

In an embodiment, the DC/DC converter 7 is continuously powered by a separate conductor 10. The conductor is connected to a separate power source (not shown). The conductor 10 is optional. The failure rate is further reduced, when using the conductor 10 connected to a separate, additional power source. For example, a plurality of solid state switches 1 can be powered via a conductor 10 using the same power source. In an embodiment, the solid-state relays can be daisy chained.

Further, there is provided a threshold device 12. The threshold device 12 is adapted to forward the operating signal only if the operating signal received from the voltage source 5 exceeds a predetermined threshold. According to an embodiment, the threshold is set in firmware or software. In other embodiments, the threshold is set with an analog circuit. In an example, the threshold is independently monitored by two full independent and isolated channels and cross-checked between channels to confirm the threshold has been met.

The solid state switch 1 comprises at least two programmable devices 14', 14". The programmable devices are powered from the DC/DC converter 7. According to embodiments, the programmable devices 14', 14" are respectively a FPGA (Field programmable gate array). A FPGA is an integrated circuit that can be programmed or reprogrammed after manufacturing. It consists of an array of programmable logic blocks and interconnects that can be configured, in particular, to perform various functions. Also other types of programmable devices can be used, for example processors, ASICS, CPLD, EEPROMs etc.

The programmable devices 14', 14" are adapted to communicate with each other via a signal connection 16. The at last two programmable devices are adapted to cross-check each other, for example via the signal connection 16.

Further, the programmable devices 14', 14" are respectively adapted to receive the operating signal from the voltage source 5, in particular via the threshold device 12. For example, the programmable devices 14', 14" are respectively adapted to receive the operating signal at an input terminal 14*a'*, 14*a"*. In an embodiment, the programmable devices 14', 14" are adapted to cross check, in particular via the signal connection 16, whether they have received the same signal from the voltage device 5 and/or the threshold device 12.

The programmable devices 14', 14" further comprising at least one switch driving terminal 14*b'*, 14*b"* for driving a switch module of a switch and at least one monitoring terminal 14*c'*, 14*c"* for each switch module for monitoring the respective switch module. For example, each programmable device 14', 14" comprises for each switch a respective switch driving terminal. In other words, in FIG. 1, each programmable device 14', 14" comprises three switch driving terminals 14*b'*, 14*b"*.

The programmable devices 14', 14" are adapted to independently read the voltage input, in particular of an operating signal, that dictates whether or not the contacts of the relay should change states. Further, the programmable devices 14', 14" are adapted to drive the switch driving terminal 14*b'*, 14*b"*, in particular based or depending on the read voltage input, and to drive the monitoring circuits or the at least one monitoring terminal 14*c'*, 14*c"*, as it will be explained further below. In other words, the programmable devices 14', 14" are adapted to generate a switch drive signal based on the read or received operating signal. In an embodiment, they only drive the switch driving terminals 14*b'*, 14*b"* in case the programmable devices 14', 14" have cross-checked that they have received the same signal from the voltage device 5 and/or the threshold device 12, for example the same 'high' signal.

The solid state switch 1 comprises at least two channels A, B. For example, the first channel A comprises first programmable device 14' and the second channel comprises the second programmable device 14". In other words, each programmable device 14', 14" defines a control channel for controlling and operating a switch in parallel. In other words, each programmable device 14', 14" controls and operates each switch, in particular independently.

In the example shown in FIG. 1, the solid state switch 1 is provided with a common contact 18, a NO output contact 20, and a NC output contact 22.

In case when there is a signal provided by the voltage source 5, which is in particular above the threshold provided by the threshold device 12, then a current flow is enabled between the common contact 18 and the NO output contact 20, and a current flow is inhibited between the common contact 18 and the NC output contact 22. In case when there is no signal provided by the voltage source 5 or when it is below the threshold provided by the threshold device 12, then a current flow is enabled between the common contact 18 and the NC output contact 22, and a current flow is inhibited between the common contact 18 and the NO output contact 20.

It should be noted that it is not necessary to have both a NO output contact and a NC output contact. The solid-state relay may have an arbitrary number of NO output contacts and an arbitrary number of NC output contacts. For example, the solid-state relay may have only one NC output contact or only one NO output contact.

FIG. 1 further discloses, as an example, a power switch or gate 24, which is electrically connected at its input terminal 24*a* with the common contact 18. The power switch 24 has further an output terminal 24*b*. The power switch is provided to activate or deactivate the function of the solid state switch 1. According to embodiments, the power switch or power gate 24 provides an independent and secondary shutdown mechanism if an electronic failure is detected on the normally open circuitry.

Further, the solid state switch 1 comprises a normally open switch 26. The NO switch 26 comprises a NO switch input terminal 26*a* and a NO switch output terminal 26*b*. The NO switch input terminal 26*a* is electrically connected between the output terminal 24*b* of the power switch 24. The NO switch output terminal 26*b* is electrically connected with the NO output contact 20.

The solid state switch 1 further comprises a normally closed switch 28. The NC switch 28 comprises a NC switch input terminal 28*a* and a NC switch output terminal 28*b*. The NC switch input terminal 28*a* is electrically connected between the output terminal 24*b* of the power switch 24. The NC switch output terminal 28*b* is electrically connected with the NC output contact 22.

In some embodiments, which may be combined with other embodiments disclosed herein the power switch 24 is omitted. In other words, the common contact 18 is directly connected to the input terminals 26*a*, 28*a* of the NO switch 26 and/or the NC switch 28.

Figure 6:
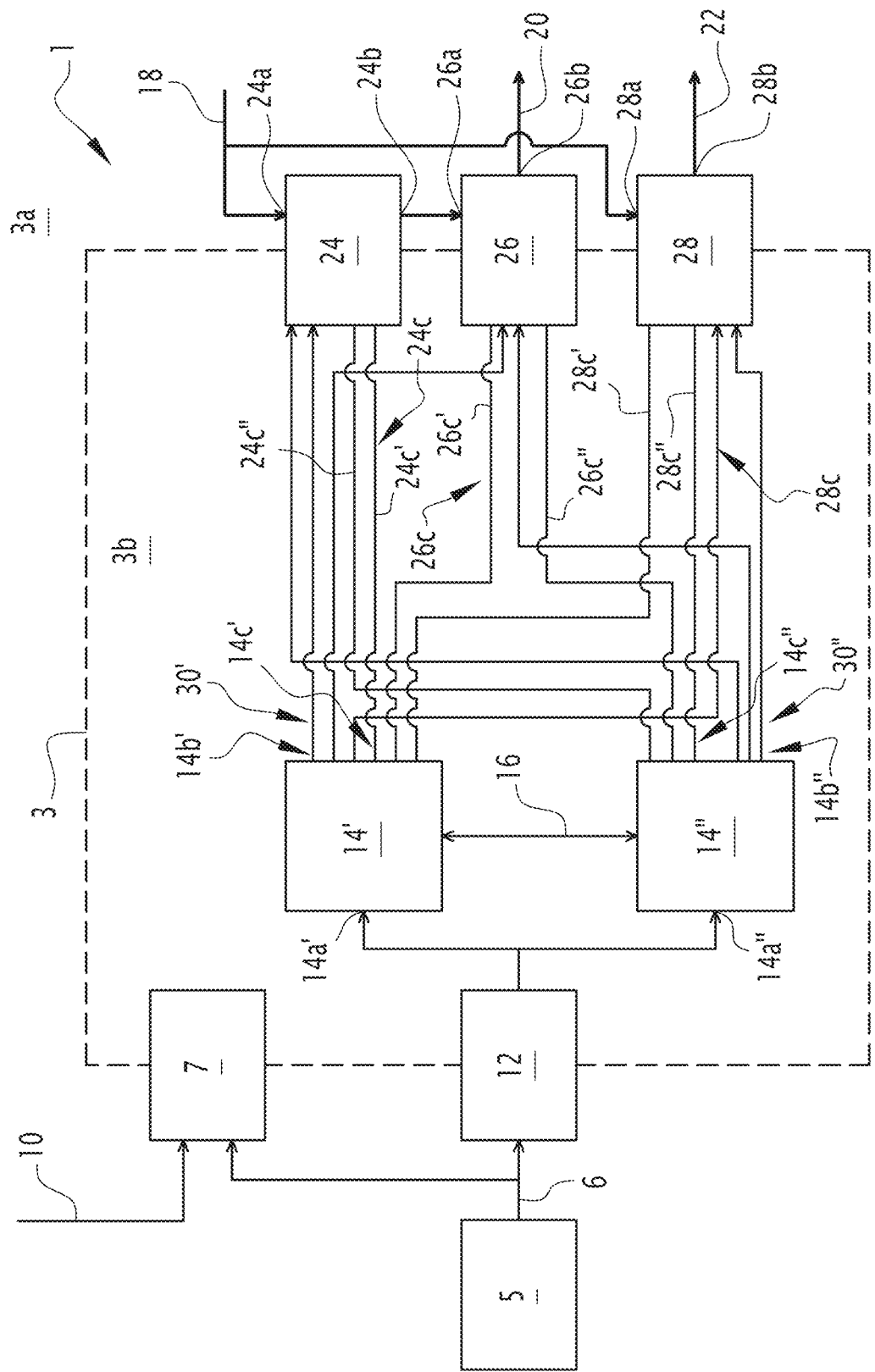
FIG. 6 shows the overall architecture of a solid state switch according to another embodiment being a variant of FIG. 1.

Another embodiment is shown in FIG. 6, which is a variant of FIG. 1. In this case, the NC switch input terminal 28*a* is electrically connected between the common contact 18. Thus, even in case of failure of one or both programmable devices 14', 14", which results in an open power switch 24, there would be still an electrical connection between the common contact 18 and the NC output contact 22.

Referring back to FIG. 1, each of the programmable devices 14', 14" controls the power switch 24 and the respective switches 26, 28, in particular via control connections 30', 30". The programmable devices 14', 14" is adapted to control the switches 24, 26, 28 simultaneously, for example by the same current, or independently. As, according to embodiments, the switches 24, 26, 28 are controlled independently, each switch 24, 26, 28 is connected with an individual control connection 30', 30" to each of the programmable devices 14', 14". For example, during operation of the solid state switch, as long as the programmable devices 14', 14" are powered, the control the power switch 24 to be closed. The switches 24, 26 are then controlled in response to the received operating signal at the respective input terminals 14*a'*, 14*a"*.

Further, in an embodiment, each set of contacts 18, 20, 22 or switches 24, 26, 28 could be independent. Since each set of contacts or switch 24, 26, 28 can be in an embodiment fully isolated and independent, each set of contacts or switch 24, 26, 28 can switch a different source or the same source to provide current sharing between channels.

The control connections 30' are assigned to the first channel A and the control connections 30" are assigned to the second channel B.

Further, each of the programmable devices 14', 14" monitors the switches 24, 26, 28 via respective a monitoring circuits 24*c*, 24*c'*, 24*c"*, 26*c*, 26*c'*, 26*c"*, 28*c*, 28*c'*, 28*c"*.

Figure 2:
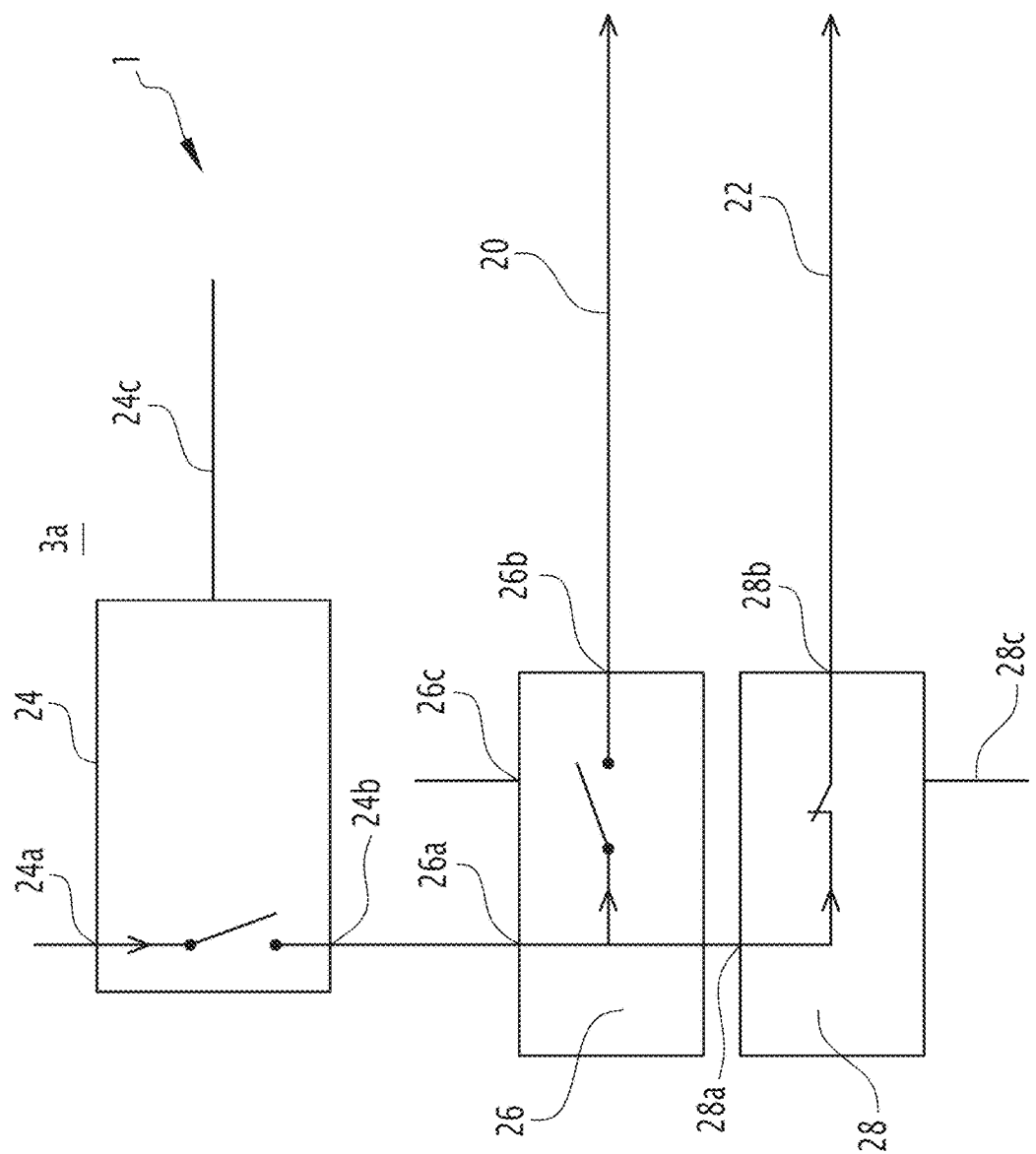
FIG. 2 shows schematically as an electrical circuit of the solid state switch of FIG. 1.

FIG. 2 shows schematically as an electrical circuit of the solid state switch 1 including the switches 24, 26, 28. Each of the switches 24, 26, 28 comprises respective monitoring or feedback circuits 24*c*, 26*c* and 28*c*. The monitoring circuit provide information about the state of the respective switches 24, 26, 28 as it will be later explained.

Figure 3:
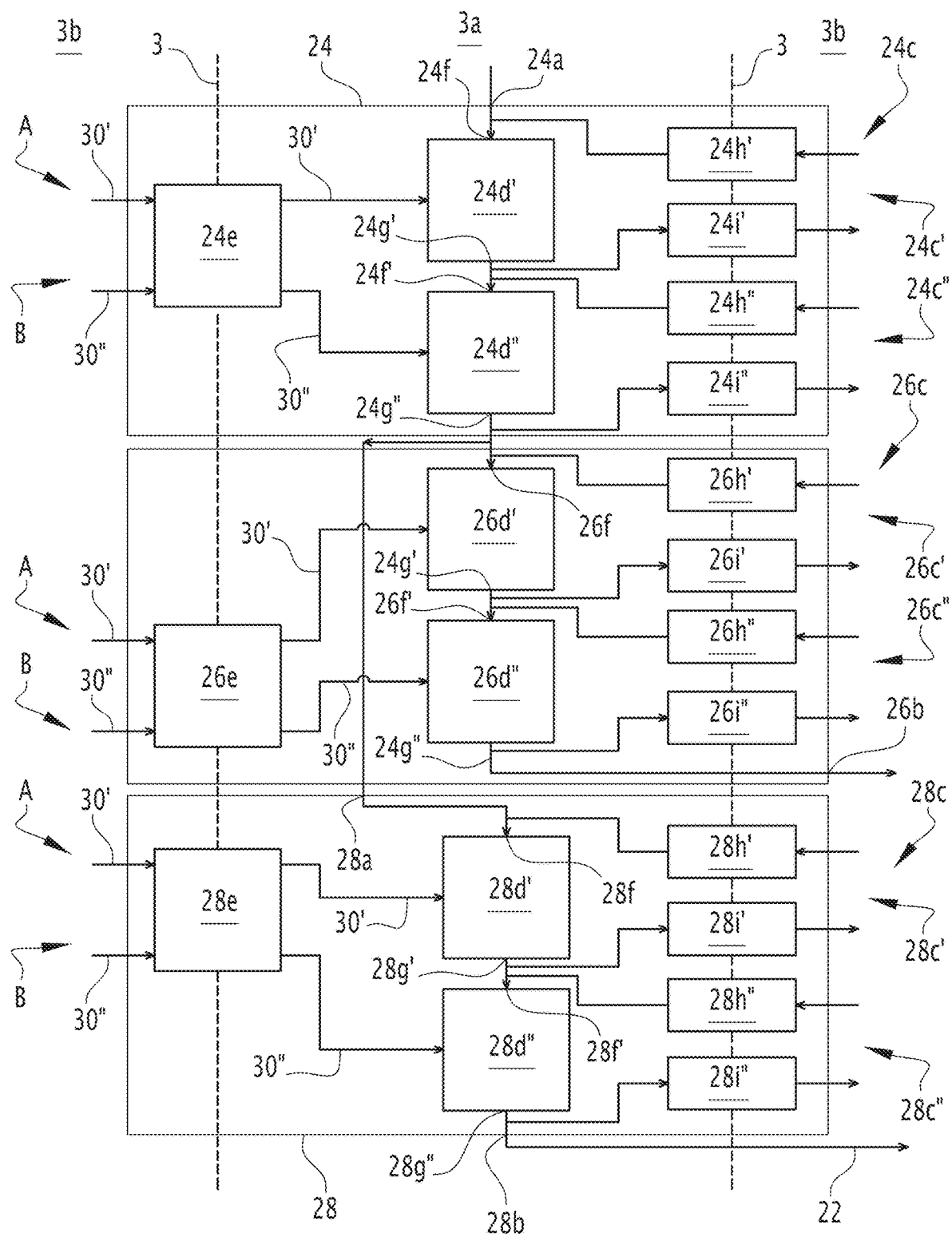
FIG. 3 shows a more detailed schematic view of the solid state switch of FIGS. 1 and 2.

FIG. 3 shows a more detailed view of the solid state switch 1 of FIGS. 1 and 2. The same reference signs relate to the same features as in FIGS. 1 and 2.

The isolation boundary 3 on both sides relates to the same isolation boundary 3. However, in order to simplify the drawings the output connections of the respective switches have been drawn towards the right and the left side.

Each switch 24, 26, 28 comprises respectively at least two switch modules 24*d'*, 24*d"*, 26*d'*, 26*d"*, 28*d'*, 28*d"* which comprise respectively at least one transistor or another type of solid state switch. for switching the current between the respective input terminal 24*a*, 26*a*, 28*a* and the respective output terminal 24*b*, 26*b*, 28*b*. The number of switch modules 24*d'*, 24*d"*, 26*d'*, 26*d"*, 28*d'*, 28*d"* corresponds to the number of programmable devices 14', 14". Each switch modules 24*d'*, 24*d"*, 26*d'*, 26*d"*, 28*d'*, 28*d"* of a switch 24, 26, 28 is assigned to a different channel. For example the switch modules 24*d'*, 26*d'*, 28*d'* are assigned to the first channel A controlled by the first programmable device 14' and the switch modules 24*d"*, 26*d"*, 28*d"* are assigned to the second channel B controlled by the second programmable device 14".

Within each switch 24, 26, 28, the respective switch modules 24*d'*, 24*d"*, 26*d'*, 26*d"*, 28*d'*, 28*d"*, in particular the transistor of the respective switch modules 24*d'*, 24*d"*, 26*d'*, 26*d"*, 28*d'*, 28*d"*, are connected in series between the respective switch input terminal 24*a*, 26*a*, 28*a* and the respective switch output terminal 24*b*, 26*b*, 28*b*. In other words, the switch module of a first channel A is connected in series with the switch module of a second channel B.

According to an embodiment, the switch modules 24*d'*, 24*d"* for the power switch 24 are of the same type, the switch modules 26*d'*, 26*d"* of the NO switch are of the same type, and the switch modules 28*d'*, 28*d"* of the NC switch are of the same type. The same type means that for each switch 24, 26, 28, the respective semiconductor switch of the switch modules 24*d'*, 24*d"*, 26*d'*, 26*d"*, 28*d'*, 28*d"* for switching the current between their respective input terminal 24*f'*, 24*f"*, 26*f'*, 26*f"*, 26*f'*, 26*f"* and the respective output terminal 24*g'*, 24*g"*, 26*g'*, 26*g"*, 28*g'*, 28*g"* is of the same type in order to provide the same function upon activation.

The control connections 30', 30" between the programmable devices 14', 14" and the respective switch modules 24*d'*, 24*d"*, 26*d'*, 26*d"*, 28*d'*, 28*d"* include respectively a galvanic isolator in a galvanic isolator group 24*e*, 26*e*, 28*e*, for example in form of photovoltaic isolators. Alternatively, opto-isolators may be used in each galvanic isolator group. It should be noted that the control connections 30', 30" between each programmable devices 14', 14" and each of the switches 24, 26, 28 are independent, even if they have the same reference sign 30' or 30" respectively. In other words, each galvanic isolator group 24*e*, 26*e*, 28*e* provides for each control connection 30', 30" a separate galvanic isolator in form of a photovoltaic isolator. For example, in case of two channels A, B, each galvanic isolator group 24*e*, 26*e*, 28*e* includes two photovoltaic isolators, one for each channel A, B. The galvanic isolator, in particular the photovoltaic isolator bridges the isolation boundary.

A photovoltaic isolator (PVI) and the opto-isolator are electronic components that transfer electrical signals between two isolated circuits by using light. The PVI and the opto-isolator comprise respectively a pair of a light emitting diode (LED) and a light detector. The photovoltaic isolator includes as a light detector a photovoltaic diode. The photovoltaic isolator has the advantage that the output behaves like a power source.

The opto-isolator comprises as a light detector a phototransistor.

The PVI or the opto-isolator is provided in a light-tight housing. The light emitted by the LED is adapted to be captured by the light detector of the respective pair.

According to embodiments, each switch module 24*d'*, 24*d"*, 26*d'*, 26*d"*, 28*d'*, 28*d"* is controlled by a respective monitoring connections 24*c*, 26*c*, 28*c*. Each monitoring connection 24c, 26c, 28c comprises for each channel A, B a monitoring circuit 24c', 24c", 26c', 26c", 28c', 28c". The monitoring circuits 24c', 26c', 28c' of the first channel A are adapted to monitor the respective switch module 24d', 26d', 28d' of the first channel A. The monitoring circuits 24c", 26c", 28c" of the second channel B are adapted to monitor the respective switch module 24d", 26d", 28d" of the second channel B. The monitoring circuits of the first channel A are connected to the first programmable device 14' and the monitoring circuits of the second channel B are connected to the second programmable device 14".

In the embodiment of FIG. 3, for that purpose each monitoring circuit 24c', 24c", 26c', 26c", 28c', 28c" is electrically connected to the input terminals 24f', 24f", 26f', 26f", 28f', 28f" and output terminals 24g', 24g", 26g', 26g", 28g', 28g" of the respective switch modules via respective galvanic isolators 24h', 24i', 24h", 24i", 26h', 26i', 26h", 26i", 28h', 28i', 28h", 28i". In some embodiments, in case the same electrical potential is used a common connection to an input/output terminal may be used. For example the output terminal 24g' has the same electrical potential as the input terminal 24f", so that only a single galvanic isolator may be used, combining the galvanic isolators 24i' and 24h". The multiple switches 24, 26, 28 provide DC and AC blocking when the connections are not intended to be made and test signals being injected via the monitoring circuits across each switch module 24d', 24d", 26d', 26d", 28d', 28d" are used for detecting a failure of a switch module as it will be explained below.

The programmable devices 14', 14" are adapted to emit via the monitoring circuit a predefined test signal to the input terminals 24f', 24f", 26f', 26f", 28f', 28f" of the switch modules 24d', 24d", 26d', 26d", 28d', 28d", for example a square signal, a sinus wave or a pulse signal with one or more pulses, and to measure a signal at the output terminals 24g', 24g", 26g', 26g", 28g', 28g" of the respective switch modules. The test signal used to test the state of the switch modules 24d', 24d", 26d', 26d", 28d', 28d" via a galvanic isolator 24h', 24i', 24h", 24i", 26h', 26i', 26h", 26i", 28h', 28i', 28h", 28i", for example a PVI or a capacitor, to generate a differential voltage across the respective switch module to detect if its open or closed. Because the energy passing through the contacts 18, 20, 22 is single ended, the differential voltage used across the switch module does not impact the energy passing through the set of contacts 18, 20, 22.

Thus, according to embodiments the switches 24, 26, 28 could be blocking for the currents passing through the set of contacts, but the test signals may still be used to determine whether the switches are correctly operating.

For example, for the first channel A, the first programmable devices 14' is adapted to emit via the sub-monitoring circuits 24c', 26c', 28c' the predefined test signal to the input terminals 24f', 26f', 28f' and to measure the signals at the respective output terminals 24g', 26g', 28g' of the switch modules. The same applies for the second channel B. The form and/or voltage of the test signal may have no relation to the current/voltage passing through the contacts 18, 20, 22 or the input terminals 24f', 24f", 26f', 26f", 28f', 28f" and output terminals 24g', 24g", 26g', 26g", 28g', 28g" of the respective switch modules.

Figure 4:
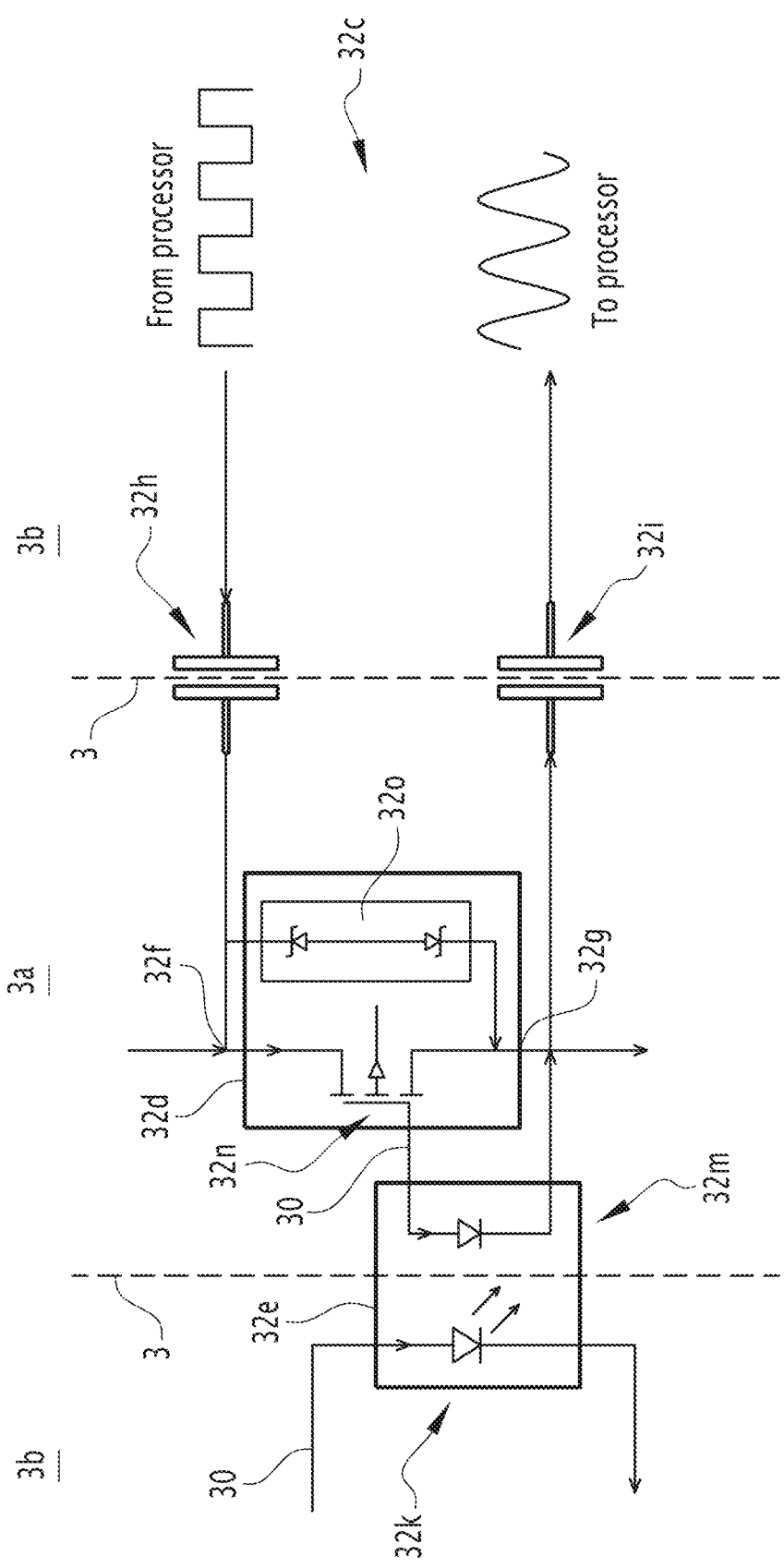
FIG. 4 shows a more detailed schematic electric circuit for a switch module.

FIG. 4 shows a more detailed view of a switch module 32 and its connections of a single channel. Such a switch module may be used as switch module 24d', 24d", 26d', 26d", 28d', 28d" in one of the channels. The same letters after the number indicate the same functions as in FIG. 3. The principal differences between the power switch 24 or NO/NC switches 26, 28 is the type of semiconductor switch used in the switch modules in order to provide a NO or NC switch. For example the input terminal 32f is connected, in an embodiment to a common contact or pole or to an output of another switch module as shown in FIG. 3. The output terminal 32g is connected for example to another switch module as shown in FIG. 3 or to a NO or NC output contact.

The photovoltaic isolator (PVI) 32e has a primary side 32k, which is connected via a control connection 30 to a switch driving terminal of a programmable device, for example the switch driving terminal 14b', 14b" of one of the programmable devices 14', 14". Thus, the PVI 32e bridges the isolation boundary, in particular by maintaining the galvanic isolation. The primary side 32k comprises a light source in form of a LED (light emitting diode). Further, the PVI 32e has a secondary side 32m, which is provided on the other side of the isolation boundary 3. The secondary side 32m includes a light detector, for example a photovoltaic diode. The PVI is provided in a light-tight housing. The light emitted by the LED is adapted to be captured by the light detector. Then a corresponding current is generated on the secondary side 32m of the control connection 30, which is connected to the switch module 32d. In other words, the control connection 30 is used to control the switch module 32d and to switch between the open and closed state, which includes the PVI 32e.

The PVI 32e provides an isolated voltage source to the switch module 32d, in particular the semiconductor switch 32n of the switch module, but is unable to source any significant current that under failure mode could be supplied to the load going through the relay pole, for example via the input terminal 32f or output terminal 32g. In embodiments, the PVI is only capable to source microamperes of current, which is sufficient to energize a MOSFET (metal oxide semiconductor field effect semiconductor) but not railroad equipment. In other words, the programmable device 14', 14" enables/disables the PVI, which opens or closes the switch module including a semiconductor switch.

The switch module 32d includes a semiconductor switch 32n, for example a field effect semiconductor (FET), in particular a MOSFET. The semiconductor switch comprises a control terminal, in particular a gate, for controlling the operation of the semiconductor switch.

The MOSFET may be a PFET, NFET, or JFET for the switch modules of the power switch 24, a PFET, NFET, or JFET for the switch modules of the NO switches 26, and a PFET, NFET, or JFET for the switch modules of the NC switches 28.

The switch module 32d further includes, optionally, a surge protection 32o. The surge protection 32o is connected between the source and the drain of the semiconductor switch 32n and/or connected between the input terminal 32f and the output terminal 32g of the switch module 32d. The surge protection 32o provide protection against lightning/transients.

The galvanic isolators 32h, 32i shown in FIG. 4 are capacitors, for example Y capacitors. In other embodiments, also PVI may be used. Y capacitors are for example defined in the norm IEC/EN 60384-14. The galvanic isolators 32h, 32i provide an electrical isolation between the digital circuitry and the isolated signal that is passing through the relay pole. In other words, the monitoring circuit 32c comprises the galvanic isolators 32h, 32i.

As already stated above, the monitoring circuit 32c is adapted to be provided with an isolated test signal, for example generated by the programmable devices 14', 14". The test signal, for example a square signal, is injected through the galvanic isolator 32h to the input terminal 32f of the switch module 32*d*. The test signal is then routed through the semiconductor switch 32*n*, for example a MOSFET, and then read via the output terminal 32*g*, a second galvanic isolator 32*i* as a feedback signal. The galvanic isolators 32*h*, 32*i* are bridging the isolation boundary 3. This allows a closed loop testing of the respective semiconductor switch 32*n* to determine if the switch is open or closed and to detect a failure. The signal path is critical in that it is single ended, meaning the ground reference does not go to the isolated relay pole net (e.g. the common contact 18, NO output contact 20 and the NC output contact 22). The test signal injected to test the switches is independent from the current/voltage passing through the set of contacts 18, 20, 22. This avoids being able to falsely energize whatever load is connected to the relay pole. There is no shared ground reference between the isolated poles (e.g. the common contact 18, NO output contact 20 and the NC output contact 22) and the (test) signals of the programmable devices 14', 14". This allows monitoring of the FET or MOSFET position without impacting the isolated pole and load.

As described above, the solid state switch includes several channels A, B. According to embodiments, in case the programmable device 14' of a first channel A detects a failure of a switch module 24*d*', 26*d*', 28*d*' of the first channel A in a switch 24, 26, 28, it can inform the programmable device 14" of the second channel B, in particular via the signal connection 16 shown in FIG. 1, and the second programmable device 14" can react on this information, and for example actuate the respective switch 24*d*", 26*d*", 28*d*" of the second channel A in the same switch 24, 26, 28, which is in particular connected in series with the failed switch. In other words, the duplication and reaction on faults enable a fast reaction. According to embodiments, when a switch is tested to be in the wrong state the programmable devices 14', 14" will react by opening all of the other switches. This avoids falsely allowing energy to pass from common contact 18 to the NO contacts 20 or NC contacts 22 in the event of an electronic component failure.

According to the disclosure, the status of the solid state switch can be remotely monitored but does not require the use of optical fibers. Further, power can be also daisy-chained from one device to another and therefore reducing the number of power wires or cables necessary to power the devices. Further, it can replace an inductive relay coil with analog design that guarantees it will not energize without sufficient energy applied, even under failure modes.

Figure 5:
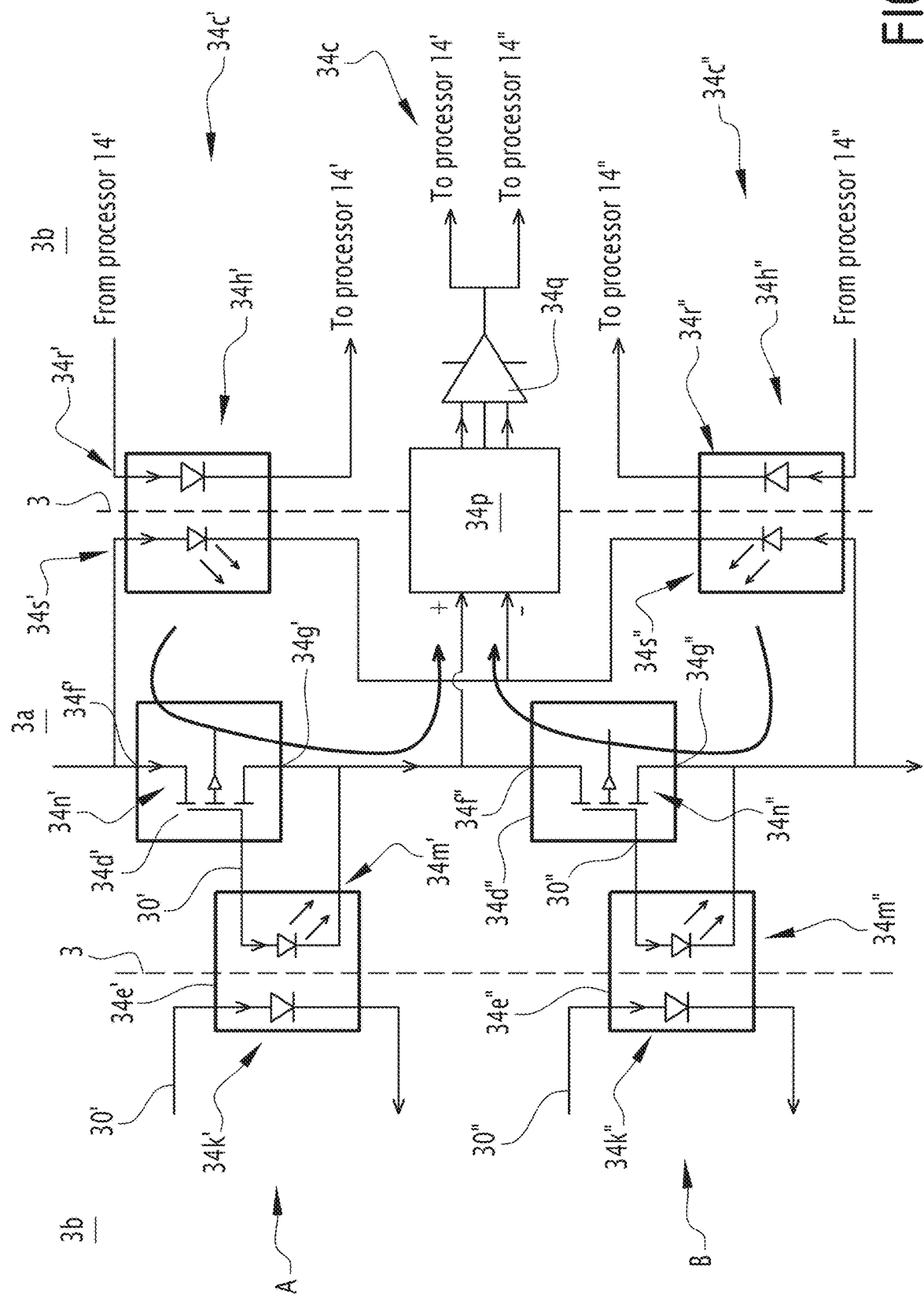
FIG. 5 shows another embodiment of a schematic electric circuit for a switch.

FIG. 5 shows another embodiment of a schematic electric circuit for a switch. The general structure of the switch may be a power switch, a NC switch or a NO switch. The only difference between these switches is the type of semiconductor switch used. The same letters after the number indicate the same functions as in FIGS. 3 and 4. The switch comprises two switch modules 34*d*', 34*d*" connected in series. The switch may be connected via the input terminal 34*f*' of the first switch module 34*d*' to a common contact or to another switch. The output terminal 34*g*" of the second switch module 34*g*" is connected to another switch or a NO or NC contact. As for the previous switches the programmable devices 14', 14" provide a command for actuating the switch via the control connections 30', 30" respectively. The galvanic isolators 34*e*', 34*e*" are of the same type as in FIG. 4, namely they are photovoltaic isolators.

The monitoring connections 34*c* comprises a first galvanic isolator 34*h*', in particular in form of a photovoltaic isolator, a second galvanic isolator 34*h*", in particular in form of a photovoltaic isolator, and an isolation amplifier 34*p*. Optionally the monitoring connections 34*c* includes a second amplifier 34*q*. An isolation amplifier is differential amplifier that allow measurement of small signals by providing electrical isolation and an electrical safety barrier. The isolation amplifier 34*p* bridges the isolation boundary 3.

The first galvanic isolator 34*h*' is assigned to the first monitoring circuit 34*c*' of the first channel A. In other words the monitoring circuit 34*c*' of the first channel comprises the first galvanic isolator 34*h*'. The second galvanic isolator 34*h*" is assigned to the second monitoring circuit 34*c*' of the second channel B. In other words the monitoring circuit 34*c*" of the second channel comprises the second galvanic isolator 34*h*". Each galvanic isolator 34*h*', 34*h*" of the monitoring circuit has a primary side 34*r*', 34*r*" secondary side 34*s*', 34*s*". The primary side 34*r*', 34*r*" is electrically connected to the respective programmable device 14', 14" of the same channel A, B. The respective programmable device 14', 14" is adapted to apply a test signal, for example a square signal, to the primary sides 34*r*', 34*r*" of the respective galvanic isolators 34*h*', 34*h*".

The secondary side 34*s*' of the first galvanic isolator 34*h*' is electrically connected between the negative input of the isolation amplifier 34*p* and the input terminal 34*f*' of the switch module 34*d*' of the first channel A. The input terminal 34*f*' of the switch module 34*d*' of the first channel A has the same electrical potential as the input terminal of the switch. The secondary side 34*s*" of the second galvanic isolator 34*h*" is electrically connected between the negative input of the isolation amplifier 34*p* and the output terminal 34*g*" of the switch module 34*d*" of the second channel B. The output terminal 34*g*" of the switch module 34*d*" of the second channel B has the same electrical potential as the output terminal of the switch. It should be noted that respectively the cathode of the light detector of the galvanic isolators 34*h*', 34*h*", in particular the photovoltaic diode, are connected to the negative input of the isolation amplifier 34*p*. The positive input of the isolation amplifier 34*p* is connected to the output terminal 34*g*' of the switch module 34*d*' of the first channel A and/or the input terminal 34*f*" of the switch module 34*d*" of the second channel B.

In other embodiments, the design could be also inverted, which means that the secondary side 34*s*' of the first galvanic isolator 34*h*' is electrically connected between the positive input of the isolation amplifier 34*p* and the input terminal 34*f*' of the switch module 34*d*' of the first channel A and the positive input of the isolation amplifier 34*p* is connected to the output terminal 34*g*' of the switch module 34*d*' of the first channel A and/or the input terminal 34*f*" of the switch module 34*d*" of the second channel B.

The semiconductor switch 34*n*' of the switch module 34*d*' of the first channel A and the semiconductor switch 34*n*" of the switch module 34*d*" of the second channel B are arranged in opposite directions, wherein, in particular the drains of both semiconductor switches 34*n*', 34*n*" or the sources of both semiconductor switches 34*n*', 34*n*" are coupled.

The output of the isolation amplifier 34*p* is provided, in particular via an optional second amplifier 34*q*, to the programmable devices 14', 14" of each of the channels A, B.

Generally, a voltage is generated on one side of each switch module and the voltage is measured on the other side of the switch. If there is a voltage, then the switch is closed. If there is no voltage, then the switch is open. With the circuit of FIG. 5 it is possible to inject a voltage at two different locations to independently test each of the switches by measuring the voltage at the midpoint between the switches through an isolated interface.

According to embodiments, which may be combined with any embodiment disclosed herein, for each switch 24, 26, 28, the semiconductor switch of the switch module 24*d'*, 26*d'*, 28*d'*, 34*d'* of the first channel A and the semiconductor switch of the switch module 24*d'*, 26*d'*, 28*d'*, 34*d'* of the second channel B are arranged such that they are connected in series with the drain and source inverted between them. In other words, the drain of the semiconductor switch of the switch module 24*d'*, 26*d'*, 28*d'*, 34*d'* of the first channel A is connected to the drain of the semiconductor switch of the switch module 24*d'*, 26*d'*, 28*d'*, 34*d'* of the second channel B. Alternatively, the source of the semiconductor switch of the switch module 24*d'*, 26*d'*, 28*d'*, 34*d'* of the first channel A is connected to the source of the semiconductor switch of the switch module 24*d'*, 26*d'*, 28*d'*, 34*d'* of the second channel B. According to embodiments, in case the use of a FET, for example a MOSFET, due to their internal body diode internal they inherently block current from passing in one direction when in the off state (i.e. when it should not conduct current between the source and the drain). In other words, often semiconductor switches, for example MOS-FETs, are unidirectional switches. In order to block AC currents between the contacts 18, 20, 22, in an embodiment the semiconductor switch of the switch module 24*d'*, 26*d'*, 28*d'*, 34*d'* of the first channel A and the semiconductor switch of the switch module 24*d'*, 26*d'*, 28*d'*, 34*d'* of the second channel B are arranged such that they are connected in series with the drain and source inverted between them.

According to embodiments, one of the programmable devices 14', 14" of one of the channels emit the test signal to one of the switch modules to generate a voltage across one of the semiconductor switches 34*n'*, 34*n"* of the same channel and then the feedback state is read from an isolated feedback signal that is fed to the programmable devices 14', 14" of each channel A, B, in particular via the isolation amplifier 34*p*. This enables to detect failures of one of the semiconductor switches 34*n'*, 34*n"* of a first channel and in particular to react, in case of a detected failure, by opening the other semiconductor switches of the second channel to ensure safe operation. Then, the other processer of the other channel may emit a test signal to the switch module one of the switch modules to generate a voltage across one of the semiconductor switches 34*n'*, 34*n"* of the same channel and then the feedback state is read from an isolated feedback signal that is fed to the programmable devices 14', 14" of each channel A, B. This enables to detect failures of one of the semiconductor switches 34*n'*, 34*n"* of a second channel and in particular to react.

According to embodiments disclosed herein, it is possible to inject a voltage on a relay contact or electronic circuit without sending the energy to the load that the switch is controlling.

According to embodiments, a method for operating a solid state switch as described herein may include the followings steps:
 upon receiving by each programmable device 14', 14" of an operating signal, providing by each programmable device 14', 14" a switch drive signal to the switch modules 24*d'*, 24*d"*, 26*d'*, 26*d"*, 28*d'*, 28*d"*, 32*d*, 34*d'*, 34*d"*. For example the control connections 30, 30', 30" are used for that purpose. The signal is provided via the PVI 32*e*, 34*e'*, 34*e"*.

For each channel A, B, the respective programmable device 14', 14" determines for the switch modules 24*d'*, 24*d"*, 26*d'*, 26*d"*, 28*d'*, 28*d"*, 32*d*, 34*d'*, 34*d"* of the channel whether the semiconductor switch 32*n*, 34*n'*, 34*n"* is in an open or closed state by injecting a test signal into the monitoring circuits and reading the monitoring circuits. For example, a test signal is a rectangular signal. The test signal is injected by one of the conductors of the monitoring circuit and read by another conductor of the monitoring circuit.

In the embodiment according to FIG. 4, the test signal is injected via the galvanic isolator 32*h*, traverses the semiconductor switch 32*n* or the switch module and is read or measured via the galvanic isolator 32*i*. In other words, the test signal traverses the semiconductor switch via the same input and output terminals 32*f*, 32*g* as the current to be switched in the first zone 3*a*. This is provided in the same manner for each channel A, B. This means that the test signal is injected on one side of a switch module of a switch and a voltage is measured by the at least one programmable device on the other side of the same switch module in order to determine whether the semiconductor switch is in an open or closed state.

In the embodiment according to FIG. 5, the test signal is injected via the galvanic isolator 34*h'*, 34*h"*, for example by one programmable devices 14', 14". The test signal traverses the respective semiconductor switch 34*n'*, 34*n"* and is read via an output of a common isolation amplifier 34' for each of the test circuits of the different channels A, B. This enables to detect failures of one one semiconductor switches 34*n'*, 34*n"* and react, in case of a detected failure, by opening the other semiconductor switches to ensure safe operation.

According to embodiments, determining for at least one switch module of the channel whether the semiconductor switch is in an open or closed state includes injecting the test signal on one side of the respective switch module 24*d'*, 24*d"*, 26*d'*, 26*d"*, 28*d'*, 28*d"*, 32*d*, 34*d'*, 34*d"* and measuring on the other side of the switch module 24*d'*, 24*d"*, 26*d'*, 26*d"*, 28*d'*, 28*d"*, 32*d*, 34*d'*, 34*d"*.

In response of detection of a failure of a switch module 24*d'*, 24*d"*, 26*d'*, 26*d"*, 28*d'*, 28*d"*, 32*d*, 34*d'*, 34*d"* of a switch 24, 26, 28 by one of the programmable devices 14', 14" informing the other programmable devices 14', 14" of the other channels about this failure. For example, if the programmable device 14' of the first channel A detects a failure of the switch module 24*d'*, the programmable device 14' informs the programmable device 14" of the second channel 14".

In response to receiving an information about a failure of a first switch module 24*d'*, 24*d"*, 26*d'*, 26*d"*, 28*d'*, 28*d"*, 32*d*, 34*d'*, 34*d"* of a switch 24, 26, 28 by a programmable device 14', 14" of another channel, deactivating, by the programmable device 14', 14", a second switch module of the switch. For example, if the programmable device 14" of the second channel B receives the information that the switch module 24*d'* of switch 24 has failure, the programmable device 14" of the second channel B deactivates the second switch module 24*d"* of the switch 24.

In an embodiment, where one of the programmable devices detects that a switch module of a normally open switch fails, for example switch module 26*d'* of normally open switch 26, in addition to deactivate the second switch module, for example switch module 26*d"*, of the same switch, one at least one of the programmable devices 14', 14" commands to open also another normally open switch like the power switch 24. This provides an enhanced security.

A computer system including one or more controllers may be implemented in the various embodiments in the described subject matter. The computer system can include a processor, main memory, storage, a bus, and input. The processor may be one or more processors. The processor executes instructions that are communicated to the processor through the main memory. The main memory feeds instructions to the processor. The main memory is also connected to the bus. The main memory may communicate with the other components of the computer system through the bus. Instructions for the computer system are transmitted to the main memory through the bus. Those instructions may be executed by the processor. Executed instructions may be passed back to the main memory to be disseminated to other components of the computer system. The storage may hold large amounts of data and retain that data while the computer system is unpowered. The storage is connected to the bus and can communicate data that the storage holds to the main memory through the bus.

The written description uses examples to disclose the present disclosure, including the best mode, and also to enable any person skilled in the art to make and use the present disclosure. While the present disclosure has been described in terms of various specific embodiments, those skilled in the art will recognize that the present disclosure can be practiced with modifications within the spirit and scope of the claims. Especially, mutually non-exclusive features of the embodiments described above may be combined with each other. The patentable scope of the present disclosure is defined by the claims, and may include other examples that occur to those skilled in the art. Such other examples are intended to be within the scope of the claims.

LIST OF REFERENCE SIGNS

A first channel
B second channel
1 solid state switch
3 isolation boundary
5 voltage source
6 relay operating signal input terminal
7 DC/DC converter
10 conductor
12 threshold device
14', 14" programmable device
14a', 14a" input terminal
14b', 14b" switch driving terminal
14c', 14c" monitoring terminal
16 Signal connection
18 common contact
20 NO output contact
22 NC output contact
24 power switch
24a power switch input terminal
24b power switch output terminal
24c monitoring connections
24c', 24c" monitoring circuit
24d', 24d" switch module
24e galvanic isolator group
24f, 24f" input terminal
24g', 24g" output terminal
24h', 24i' galvanic isolator
24h", 24i" galvanic isolator
26 NO switch
26a NO switch input terminal
26b NO switch output terminal
26c monitoring connections
26c', 26c" monitoring circuit
26d', 26d" switch module
26e galvanic isolator group
26f, 26f" input terminal
26g', 26g" output terminal
26h', 26i' galvanic isolator
26h", 26i" galvanic isolator
28 NC switch
28a NC switch input terminal
28b NC switch output terminal
28c monitoring connections
26c', 26c" monitoring circuit
28d', 28d" switch module
28e galvanic isolator group
28f, 28f" input terminal
28g', 28g" output terminal
28h', 28i' galvanic isolator
28h", 28i" galvanic isolator
30, 30', 30" control connections
32c monitoring circuit
32d switch module
32e galvanic isolator
32f input terminal
32g output terminal
32h galvanic isolator
32i galvanic isolator
32k primary side
32m secondary side
32n semiconductor switch
32o surge protection
34c monitoring connection
34c', 34c" monitoring circuit
34d', 34d" switch module
34e', 34e" galvanic isolator
34f, 34f" input terminal
34g', 34g" output terminal
34h', 34h" galvanic isolator
34k', 34k" primary side
34m', 34m" secondary side
34n', 34n" semiconductor switch
34p isolation amplifier
34q amplifier
34r', 34r" primary side
34s', 34s" secondary side

What is claimed is:

1. A solid state switch, in particular for a railroad equipment, comprising:
an isolation boundary, the isolation boundary galvanically isolating a first zone from a second zone;
at least one switch, each switch being adapted to switch a current in the first zone between a switch input terminal and a switch output terminal;
at least one relay operating signal input terminal adapted to receive an operating signal, the operating signal indicating whether to switch the at least one switch; and
at least two channels, each channel comprising:
for each switch a switch module in the first zone, each switch module comprising a switch module input terminal, a switch module output terminal and a semiconductor switch adapted to switch the current between the switch module input terminal and the switch module output terminal;
at least one programmable device in the second zone, the at least one programmable device comprising an input terminal for receiving the operating signal, at least one switch driving terminal for driving the switch module of the respective channel and at least one monitoring terminal for each switch module for monitoring the respective switch module;
a control connection connecting the switch driving terminal of the at least one programmable device and a control terminal of the semiconductor switch, wherein the control connection comprises at least one first photovoltaic isolator for bridging the isolation boundary; and at least one monitoring circuit for each switch module connecting the respective monitoring terminal of the at least one programmable device, wherein the monitoring circuit comprises at least one galvanic isolator for bridging the isolation boundary, wherein the monitoring circuit connects to at least one of the switch module input terminal and the switch module output terminal.

2. The solid state switch according to claim 1, wherein for each channel the at least one programmable device is adapted to inject a test signal on one side of a switch module of a switch and to measure a voltage on the other side of the same switch module in order to determine whether the semiconductor switch is in an open or closed state.

3. The solid state switch according to claim 1, wherein the programmable devices of each channel is an FPGA.

4. The solid state switch according to claim 1, wherein for each switch, the switch modules of the respective channels are connected in series, such that the semiconductor switches of the respective switch modules of each switch are connected in series.

5. The solid state switch according to claim 1, wherein the semiconductor switch is a field effect transistor, in particular a metal oxide semiconductor field effect transistor, wherein the control terminal is a gate of the field effect transistor.

6. The solid state switch according to claim 1, wherein the monitoring circuit of a respective channel connects the programmable device, in particular the monitoring terminal of the programmable device, to both, the switch module input terminal and the switch module output terminal of the same channel.

7. The solid state switch according to claim 1, wherein the semiconductor switch of the switch module of the first channel and the semiconductor switch of the switch module of the second channel are arranged in opposite directions, wherein, in particular drains of both semiconductor switches or sources of both semiconductor switches are coupled.

8. The solid state switch according to claim 7, wherein the at least one galvanic isolator of the monitoring circuit of each channel comprises respectively a photovoltaic isolator, a secondary side of the galvanic isolator of the monitoring circuit of the first channel is electrically connected between the first input of an isolation amplifier and the switch module input terminal of the switch module of the first channel, the switch module input terminal having an electrical potential as same as the switch input terminal, and a secondary side of the galvanic isolator of the monitoring circuit of the second channel is electrically connected between the first input of the isolation amplifier and the switch module output terminal of the switch module of the second channel, the switch module output terminal having an electrical potential as same as the switch output terminal, the second input of the isolation amplifier being coupled to the switch module output terminal of the switch module of the first channel.

9. The solid state switch according to claim 1, wherein the at least one galvanic isolator of the monitoring circuit is selected from the group consisting of a capacitor, a second photovoltaic isolator, and an isolation amplifier.

10. The solid state switch according to claim 1, wherein the programmable device is adapted to apply a test signal to the monitoring circuit.

11. The solid state switch according to claim 10, wherein the test signal is a rectangular signal.

12. A railroad equipment comprising a solid state switch, the solid state switch comprising:

an isolation boundary, the isolation boundary galvanically isolating a first zone from a second zone;

at least one switch, each switch being adapted to switch a current in the first zone between a switch input terminal and a switch output terminal;

at least one relay operating signal input terminal adapted to receive an operating signal, the operating signal indicating whether to switch the at least one switch; and at least two channels, each channel comprising:

for each switch a switch module in the first zone, each switch module comprising a switch module input terminal, a switch module output terminal and a semiconductor switch adapted to switch the current between the switch module input terminal and the switch module output terminal;

at least one programmable device in the second zone, the at least one programmable device comprising an input terminal for receiving the operating signal, at least one switch driving terminal for driving the switch module of the respective channel and at least one monitoring terminal for each switch module for monitoring the respective switch module;

a control connection connecting the switch driving terminal of the at least one programmable device and a control terminal of the semiconductor switch, wherein the control connection comprises at least one first photovoltaic isolator for bridging the isolation boundary; and at least one monitoring circuit for each switch module connecting the respective monitoring terminal of the at least one programmable device, wherein the monitoring circuit comprises at least one galvanic isolator for bridging the isolation boundary, wherein the monitoring circuit connects to at least one of the switch module input terminal and the switch module output terminal.

13. A method for operating a solid state switch, the solid state switch comprising:

an isolation boundary, the isolation boundary galvanically isolating a first zone from a second zone;

at least one switch, each switch being adapted to switch a current in the first zone between a switch input terminal and a switch output terminal;

at least one relay operating signal input terminal adapted to receive an operating signal, the operating signal indicating whether to switch the at least one switch; and at least two channels, each channel comprising:

for each switch a switch module in the first zone, each switch module comprising a switch module input terminal, a switch module output terminal and a semiconductor switch adapted to switch the current between the switch module input terminal and the switch module output terminal;

at least one programmable device in the second zone, the at least one programmable device comprising an input terminal for receiving the operating signal, at least one switch driving terminal for driving the switch module of the respective channel and at least one monitoring terminal for each switch module for monitoring the respective switch module;

a control connection connecting the switch driving terminal of the at least one programmable device and a control terminal of the semiconductor switch, wherein the control connection comprises at least one first photovoltaic isolator for bridging the isolation boundary;

at least one monitoring circuit for each switch module connecting the respective monitoring terminal of the at least one programmable device, wherein the monitoring circuit comprises at least one galvanic isolator for bridging the isolation boundary, wherein the monitoring circuit connects to at least one of the switch module input terminal and the switch module output terminal, wherein the method comprises:

upon receiving by each programmable device of an operating signal, providing by each programmable device a switch drive signal to the switch modules;

for each channel, the respective programmable device determining for at least one switch module of the channel whether the semiconductor switch is in an open or closed state by injecting a test signal into the monitoring circuits and reading the monitoring circuits;

in response of detection of a failure of a switch module of a switch by one of the programmable devices informing the programmable device of the other channels about said failure; and in response to receiving an information about a failure of a first switch module of a switch by a programmable device of another channel, deactivating, by the programmable device, a second switch module of the switch.

14. The method according to claim 13, wherein determining for at least one switch module of the channel whether the semiconductor switch is in an open or closed state includes injecting the test signal on one side of the respective switch module and measuring on the other side of the switch module.

* * * * *